(12) United States Patent
Mitra et al.

(10) Patent No.: US 7,768,705 B2
(45) Date of Patent: Aug. 3, 2010

(54) OPTICAL IRRADIATION DEVICE FOR THE POLARIZATION OF ALKALI ATOMS AND A DEVICE FOR THE HYPERPOLARIZATION OF NOBLE GASES

(75) Inventors: Thomas Mitra, Dortmund (DE); Markus Revermann, Bawinkel (DE); Frank Felice, Dortmund (DE)

(73) Assignee: Limo Patentverwaltung GmbH & Co. KG, Gerstengrund (DE)

( * ) Notice: Subject to any disclaimer, the term of this patent is extended or adjusted under 35 U.S.C. 154(b) by 140 days.

(21) Appl. No.: 11/917,097

(22) PCT Filed: Jun. 8, 2005

(86) PCT No.: PCT/EP2005/006150
§ 371 (c)(1),
(2), (4) Date: Mar. 27, 2008

(87) PCT Pub. No.: WO2006/131133
PCT Pub. Date: Dec. 14, 2006

(65) Prior Publication Data
US 2008/0212634 A1    Sep. 4, 2008

(51) Int. Cl.
*G02B 5/18* (2006.01)

(52) U.S. Cl. .................. 359/569; 359/566; 359/572

(58) Field of Classification Search .................. 250/251; 356/364; 359/566, 569, 572–573, 576; 372/102; 600/410
See application file for complete search history.

(56) References Cited

U.S. PATENT DOCUMENTS 6,584,133 B1 *   6/2003   Walker et al. .................. 372/92

OTHER PUBLICATIONS

Bien Chann, Studies of Spin-Exchange Optical Pumping, 2003, University of Wisconsin-Madison, pp. 1-3, 59-68, 124-139.*

* cited by examiner

Primary Examiner—Joshua L Pritchett
(74) Attorney, Agent, or Firm—Laurence A. Greenberg; Werner H. Stemer; Ralph E. Locher

(57) ABSTRACT

An optical irradiation device for the polarization of alkali metal atoms for the hyperpolarization of noble gases by spin exchange includes at least one semiconductor laser device which can generate laser light which, with regard to its wavelength, is suitable for the polarization of the alkali metal atoms. A polarizer effects circular polarization of the laser light generated by the semiconductor laser device. A device for introducing the laser light into a working region in which the alkali metal atoms to be polarized can be present, and a device for defining a wavelength of the laser light, which can couple part of the laser light back into the semiconductor laser device in order thereby to define the wavelength of the laser light at a predetermined wavelength or a predetermined wavelength range.

10 Claims, 2 Drawing Sheets

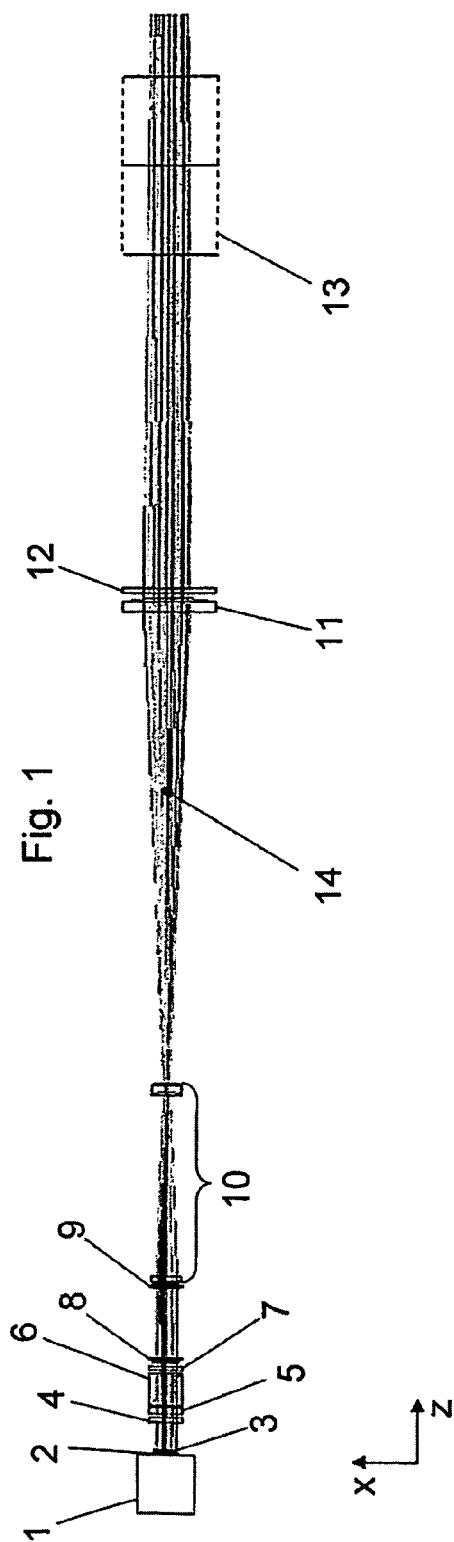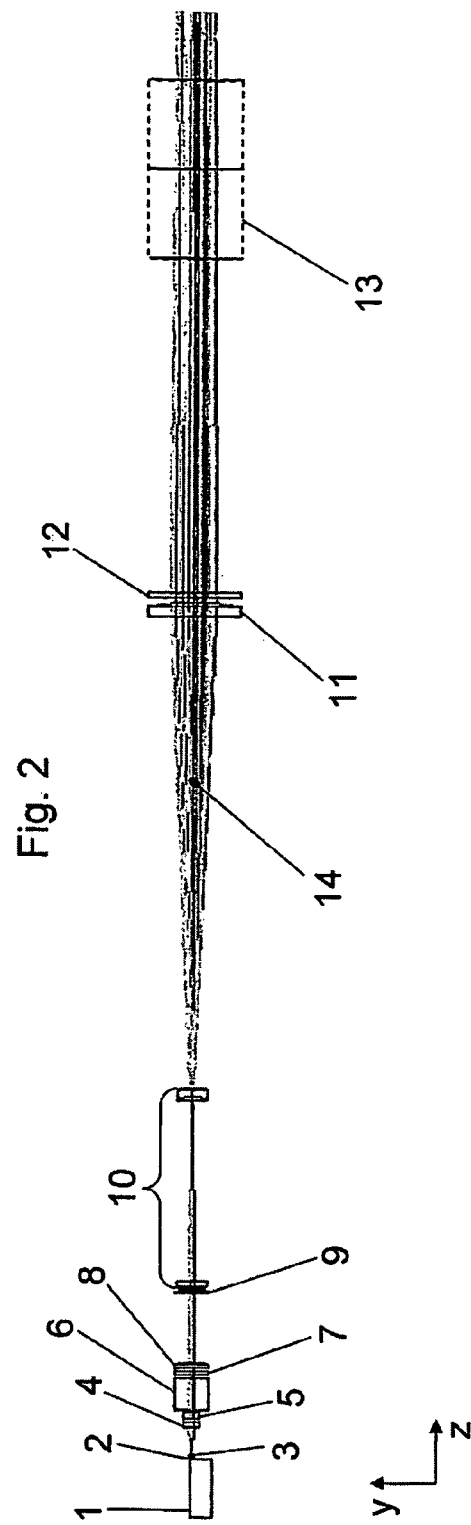

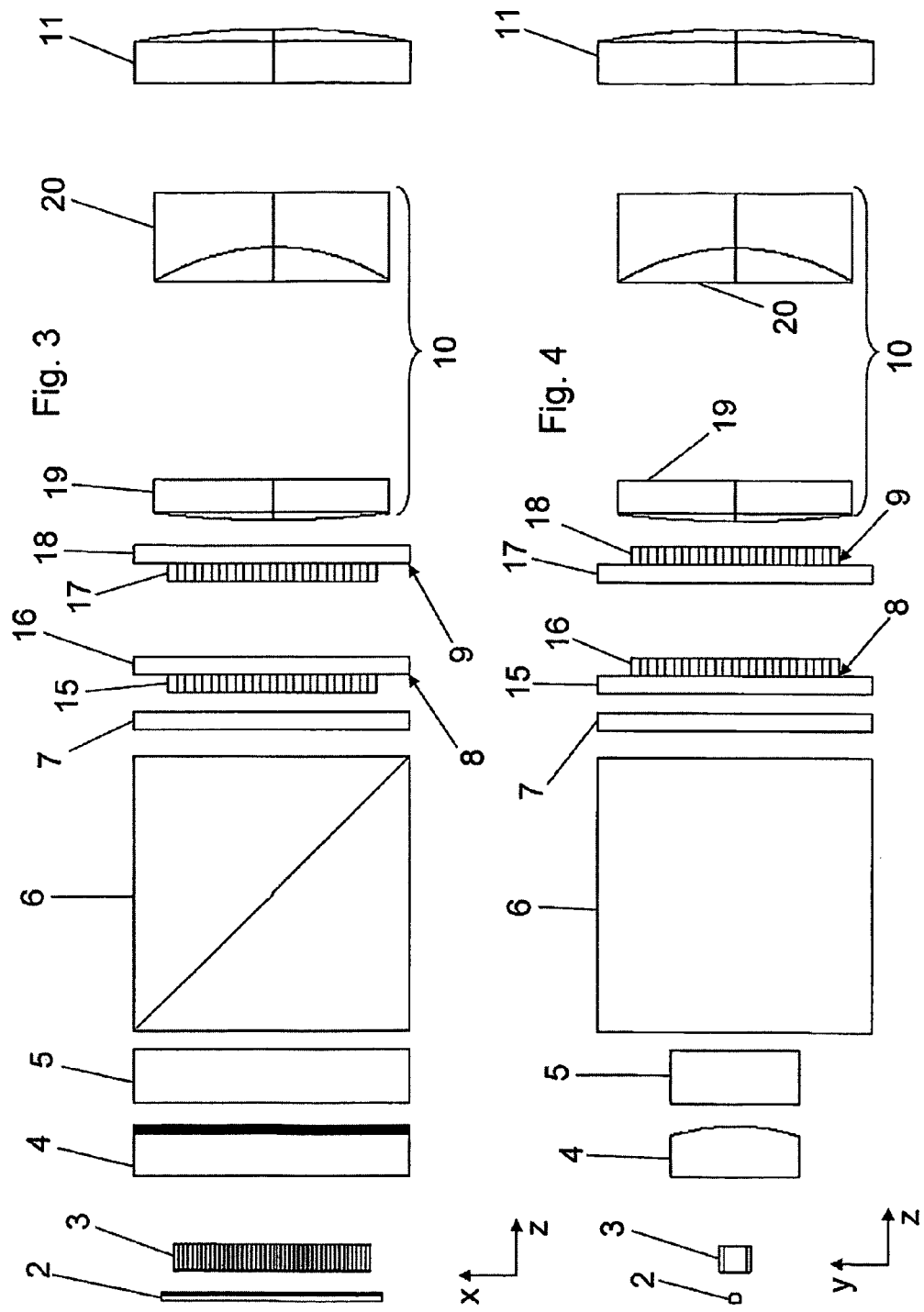

OPTICAL IRRADIATION DEVICE FOR THE POLARIZATION OF ALKALI ATOMS AND A DEVICE FOR THE HYPERPOLARIZATION OF NOBLE GASES

BACKGROUND OF THE INVENTION

Field of the Invention

The present invention relates to an optical irradiation device, in particular for polarizing alkali atoms, comprising at least one semiconductor laser device which can produce laser light which is suitable, with respect to its wavelength, for polarizing the alkali atoms, polarization means for circular polarization of the laser light produced by the at least one semiconductor laser device, and means for introducing the laser light into a working area in which the alkali atoms to be polarized can be arranged. The present invention furthermore relates to a device for hyperpolarizing noble gases, comprising an optical irradiation device of the type mentioned above for polarizing alkali atoms and means for hyperpolarizing a noble gas by spin exchange with the polarized alkali atoms.

Hyperpolarized noble gases can be useful for MRI (Magnetic Resonance Imaging) measurements. Hyperpolarization of noble gases or the nuclei of noble gases can be realized by spin exchange with polarized alkali atoms. Polarization of alkali atoms can be achieved by absorption of circularly polarized light of an appropriate wavelength. Here, the bandwidth and the circular polarization degree of the radiated light are important parameters for the effectiveness of the hyperpolarization to be achieved. Furthermore, the wavelength of the radiated light should correspond as exactly as possible to the corresponding absorption wavelength for the polarization of the alkali atoms.

An irradiation device for polarizing alkali atoms and a device for hyperpolarizing noble gases of the type mentioned in the introduction are known from European Patent EP 0 896 655 B1. One of the embodiments described therein comprises, in addition to a semiconductor laser device and an optics for introducing the light into the working area, a polarization beam splitter for producing linearly polarized light and a 4/λ-plate for converting the linearly polarized light into circularly polarized light.

A disadvantage of this prior art is the fact that a complicated way of controlling the temperature must be effected in order to keep the wavelength of the exiting laser light at least halfway constant via a constant temperature of the semiconductor laser device. Furthermore, it is not possible to homogeneously irradiate a larger working area using such a device.

BRIEF SUMMARY OF THE INVENTION

The problem on which the present invention is based is the provision of an irradiation device and a device for hyperpolarizing noble gases of the type mentioned in the introduction with a more effective design.

The invention achieves this with regard to the irradiation device by virtue of an irradiation device of the type mentioned in the introduction having the characterizing features, as claimed, and with regard to a device for hyperpolarizing noble gases by virtue of a device for hyperpolarizing noble gases of the type mentioned in the introduction having certain further claimed characterizing features.

An irradiation device including means for fixing the wavelength of the laser light is provided, which means can feed back some of the laser light into the semiconductor laser device in order to thus fix the wavelength of the laser light at a predetermined wavelength or a predetermined wavelength range. The means for fixing the wavelength of the laser light can be used to dispense with a complicated way of controlling the temperature because the wavelength is kept constant by optical means. Such a way of optically fixing or stabilizing the wavelength can, under certain circumstances, also lead to a more exact maintenance of the wavelength and, under certain circumstances, also to a smaller bandwidth of the laser light.

Here, provision may be made for the means for fixing the wavelength of the laser light to be in the form of gratings, in particular Bragg gratings or Littrow gratings.

An irradiation device is provided that includes homogenizer means which can homogenize the laser light. Such homogenizer means can be used to permit as homogeneous lighting of a comparably large working area as possible.

Provision may be made here for the homogenizer means to have a two-stage design. This increases the homogeneity of the laser light in the working area further.

Moreover, provision may be made for the homogenizer means to be able to homogenize the laser light with respect to two mutually perpendicular directions.

In particular, provision may be made for the homogenizer means to comprise at least one optically functional interface with a lens array, in particular a cylinder lens array. Such homogenizer means can be used to realize effective homogenization with simple means.

The means for introducing the laser light into a working area can comprise at least one lens. This may be a spherical lens. As an alternative, mutually intersecting cylinder lenses can also be used.

It is also possible for the irradiation device to comprise a telescopic unit. This telescopic unit can contribute to the expansion of the laser light.

An optical irradiation device according to the invention is provided.

Further features and advantages of the present invention are clearly illustrated using the following description of preferred exemplary embodiments with reference to the attached figures, in which:

BRIEF DESCRIPTION OF THE SEVERAL VIEWS OF THE DRAWING

FIG. 1 shows a side view of an irradiation device according to the invention with parts of a device for hyperpolarizing noble gases according to the invention;

FIG. 2 shows a side view, which is rotated through 90°, of the irradiation device with parts of the device for hyperpolarizing noble gases according to the invention;

FIG. 3 shows an enlarged side view of a few details of the irradiation device with unrealistic distances between the individual components; and FIG. 4 shows a view which corresponds to FIG. 3 but is rotated through 90°.

DESCRIPTION OF THE INVENTION

For better orientation, Cartesian coordinate axes x, y, z are drawn in the figures.

In the propagation direction z of the laser light 14, the irradiation device shown in FIG. 1 and FIG. 2 comprises, one after the other, a semiconductor laser device 1, a fast axis collimation lens 2, a device 3 for optical beam transformation, a slow axis collimation lens 4, means 5 for fixing the wavelength of the laser light 14, polarization means 6 for linearly polarizing the laser light 14, polarization means 7 for circularly polarizing the laser light 14, first and second homogenizer means 8, 9, a telescopic unit 10, a lens 11 in the form of a spherical planoconvex lens, and a window 12.

The laser light 14 exiting from the window in the positive z direction enters a schematically indicated apparatus 13 which is part of the device for hyperpolarizing noble gases. Alkali atoms which can be polarized by absorption of the laser light 14 are located in this device. Noble gas nuclei likewise located in the apparatus 13 can be hyperpolarized by means of spin exchange with the polarized alkali atoms.

The semiconductor laser device 1 can, for example, be in the form of a laser diode bar which represents a substantially linear light source. Instead of a linear light source, it is also possible for a punctiform light source or a light source comprising groups of point sources or a surface light source with any desired angular distribution to be used. The laser diode bar substantially extends in the x direction in which it has, for example, an extension of 10 mm. On the other hand, the extension of the laser diode bar in the y direction is about 1 µm. The light emitted by the laser diode bar has a substantially larger divergence in the direction of the y axis, the so-called fast axis, than in the direction of the x axis, the so-called slow axis. The divergence in the y direction is, for example, about 0.5 rad, whereas the divergence in the x direction is, for example, about 0.1 rad. Furthermore, a laser diode bar is subdivided in the x direction into a plurality of emitting sections, for example into 19 to 25 sections in its longitudinal direction.

The light coming from the semiconductor laser device 1 is collimated in a fast axis collimation lens 2 which substantially extends in the x direction in a diffraction-limited manner such that the divergence in the y direction is now only 0.005 rad, for example, with the result that the light 9 behind the fast axis collimation lens 2 substantially extends parallel to the y axis. The fast axis collimation lens 2 can, for example, be in the form of an aspherical planoconvex cylinder lens with the cylindrical axis in the x direction.

In the device 3 for optical beam transformation, the incident light is rotated through an angle of 90°. The device 3 for optical beam transformation can be a substantially cuboid block made of a transparent material, on which a plurality of cylinder lens segments are arranged both on the entry side and on the exit side such that they are mutually parallel. The axes of the cylinder lens segments include, with the base side of the cuboid device 3 which extends in the x direction, an angle of 45°. It may be provided, by way of example, that the depth, measured in the z direction, of the biconvex cylinder lenses formed by the cylinder lens array is equivalent to twice the focal length of each of these biconvex cylinder lenses. Each of the biconvex cylinder lenses transfers a parallel light beam again into a parallel light beam.

Partial beams coming from individual sections of the emitting sections of the laser diode bar undergo, when passing through the device 3, a rotation through 90° with the result that the individual partial beams, once they have passed through the device 3, each now only have an extension in the y direction. This prevents the partial beams emerging from individual sections of the light source 1 from overlapping on account of the divergence which is, under certain circumstances, relatively strong upstream of the device 3 in the x direction because, once they have passed through the device 3, only a diffraction-limited residual divergence in the x direction is present, whereas the divergence in the y direction of the initial divergence in the y direction corresponds to, for example, about 0.1 rad.

Such a light beam which is divergent in the x direction only to a negligible degree and moderately divergent in the y direction can be collimated by the slow axis collimation lens 4, which is, for example, in the form of an aspherical planoconvex cylinder lens with a cylinder axis in the x direction, with respect to the slow axis which now extends in the y direction (see also, in this respect, FIG. 3 and FIG. 4).

Another design of the fast axis collimation lens 2 and the slow axis collimation lens 4 can, under certain circumstances, mean that the device 3 for beam transformation can be dispensed with.

The means 5 for fixing the wavelength of the laser light can be in the form of gratings, in particular in the form of Bragg gratings or Littrow gratings. A component, in particular a small component, of the laser light 14 of a specific wavelength $\lambda$ is reflected back by this grating and re-enters the resonator of the semiconductor laser device 1. This causes the resonator to emit laser light substantially at the reflected-back wavelength $\lambda$ with the result that the laser light 14 exiting the semiconductor laser device 1 is substantially light of the wavelength $\lambda$. The means 5 for fixing the wavelength of the laser light can also be arranged, rather than the position shown in FIG. 3 and FIG. 4, between the fast axis collimation lens 2 and the device 3 for optical beam transformation, or else between the device 3 for optical beam transformation and the slow axis collimation lens 4. Furthermore, the means 5 for fixing the wavelength can also be integrated in the fast axis collimation lens 2, in the device 3 for optical beam transformation or in the slow axis collimation lens 4. It is possible, in particular, for a Bragg grating to be formed in the abovementioned components, for example by periodic refractive index variations.

The polarization means 6 for linearly polarizing the laser light 14 are, in the exemplary embodiment shown, in the form of a cube-shaped polarization beam splitter. Alternative polarization means, such as, for example, thin-layer polarizers or Brewster plates are also suitable. Before the laser light of the semiconductor laser device 1 enters the polarization means 6 for linear polarization, it has a linear polarization degree of more than 90%. Once it has passed through the polarization means 6 for linear polarization, said polarization degree is significantly higher.

Once the laser light 14 has passed through the polarization means 6 for linear polarization, it impinges on the polarization means 7 for circular polarization. In this polarization means 7 for circular polarization, the laser light 14, which is linearly polarized to a high degree, is converted to laser light 14 which is circularly polarized to a high degree. A $4/\lambda$-plate is used as polarization means 7 for circularly polarizing the laser light 14 in the exemplary embodiment shown. Other polarization means for circularly polarizing the laser light can also be used.

The first and second homogenizer means 8, 9 following the polarization means 7 in the propagation direction z of the laser light 14 are in each case in the form of a transparent substrate with cylinder lens arrays 15, 16, 17, 18 on the respective entry side and the respective exit side. Such homogenizer means 8, 9 have long been known in the prior art. In particular, the focal lengths of the cylinder lens arrays 15, 16 of the first homogenizer means 8 are less than or equal to the distance between the respective entry surfaces of the homogenizer means 8, 9, or less than or equal to the distance between the respective exit surfaces of the homogenizer means 8, 9.

The cylinder axes of the cylinder lens arrays 15, 17 on the entry sides of the homogenizer means 8, 9 are aligned in the y direction in the exemplary embodiment shown. Said cylinder lens arrays 15, 17 homogenize the laser light 14 with respect to the x direction. The cylinder axes of the cylinder lens arrays 16, 18 on the exit sides of the homogenizer means 8, 9 are aligned in the x direction in the exemplary embodiment shown. Said cylinder lens arrays 16, 18 homogenize the laser light 14 with respect to the y direction. Due to the homogenizer means 8, 9, the laser light 14 is thus homogenized with respect to two mutually perpendicular directions x, y in two stages arranged one after the other.

Alternatively, the cylinder axes of the cylinder lens arrays 15, 16 of the first homogenizer means 8 can also be aligned mutually parallel, for example, in the x direction. In this case, the cylinder axes of the cylinder lens arrays 17, 18 of the second homogenizer means 9 could be aligned mutually parallel in the y direction.

It is also possible for homogenizer means of a different design to be used. Furthermore, the homogenizer means can also be positioned differently, for example between the polarization means 6 for linear polarization and the polarization means 7 for circular polarization.

The telescopic unit 10 in the exemplary embodiment shown comprises two spherical lenses 19, 20 which are arranged one after the other in the z direction at a mutual distance corresponding to the sum of their focal lengths. The telescopic unit 10 serves for the expansion of the laser radiation 14. In the area of the telescopic unit 10, the laser light 14 has large divergence angles and a small focal point.

The lens 11 which is in the form of a spherical planoconvex lens and arranged in the propagation direction z of the laser light 14 downstream of the telescopic unit 10 has a distance with respect to the telescopic unit 10 or the focal point of the telescopic unit 10 which roughly corresponds to the focal length of the lens 11. The focal length of the lens 11 can be, for example, 200 mm. FIG. 1 and FIG. 2 show that the laser light 14 in the z direction downstream of the lens 11 is substantially collimated. The cross section of the laser light 14, once it passes through the lens 11, can in this case have an extension of, for example, 30 mm to 40 mm.

It is also possible to use two mutually intersecting cylinder lenses rather than a spherical planoconvex lens, for example.

It is furthermore possible that at least two, in particular a plurality of, semiconductor laser devices 1 are used. The laser light coming from said devices can, for example, be coupled with each other upstream of the polarization means 6 for linear polarization by means of mirrors and/or prisms. Another possibility is also the coupling of the laser light coming from the at least two semiconductor laser devices 1 into the polarization means 6 for linear polarization which are in the form of a polarization beam splitter.

The invention claimed is:

1. An optical irradiation device for polarizing alkali atoms, comprising:
   at least one semiconductor laser device configured to generate laser light that is suitable, with respect to a wavelength thereof, for polarizing alkali atoms;
   a polarizer for circular polarization of the laser light generated by said at least one semiconductor laser device;
   means for introducing the laser light into a working area configured to hold therein the alkali atoms to be polarized;
   means for defining the wavelength of the laser light and for coupling back a portion of the laser light into the semiconductor laser device for defining the wavelength of the laser light at a predetermined wavelength or a predetermined wavelength range; and
   a homogenizer that homogenizes the laser light, the homogenizer being disposed downstream in the propagation direction of the laser light from said means for defining the wavelength.

2. The irradiation device according to claim 1, wherein said means for defining the wavelength of the laser light are in the form of gratings.

3. The irradiation device according to claim 2, wherein said gratings are Bragg gratings or Littrow gratings.

4. The irradiation device according to claim 1, wherein said homogenizer is a two-stage homogenizer.

5. The irradiation device according to claim 1, wherein said homogenizer is configured to homogenize the laser light with respect to two mutually perpendicular directions.

6. The irradiation device according to claim 1, wherein said homogenizer comprises at least one optically functional interface with a lens array.

7. The irradiation device according to claim 1, wherein said homogenizer comprises at least one optically functional interface with a cylindrical lens array.

8. The irradiation device according to claim 1, wherein said means for introducing the laser light into a working area comprise at least one lens.

9. The irradiation device according to claim 1, which further comprises a telescopic unit disposed between said at least one semiconductor laser device and the working area for holding the alkali atoms.

10. A device for hyperpolarizing noble gases, comprising:
    an optical irradiation device for polarizing alkali atoms according to claim 1; and
    means for hyperpolarizing a noble gas by spin exchange with the polarized alkali atoms polarized by said optical irradiation device.

* * * * *